United States Patent
Beroz et al.

(10) Patent No.: US 6,873,039 B2
(45) Date of Patent: Mar. 29, 2005

(54) METHODS OF MAKING MICROELECTRONIC PACKAGES INCLUDING ELECTRICALLY AND/OR THERMALLY CONDUCTIVE ELEMENT

(75) Inventors: Masud Beroz, Livermore, CA (US); Bob Wen Zhong Kong, Newark, CA (US); Michael Warner, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/607,289

(22) Filed: Jun. 26, 2003

(65) Prior Publication Data

US 2004/0157362 A1 Aug. 12, 2004

Related U.S. Application Data

(60) Provisional application No. 60/391,814, filed on Jun. 27, 2002.

(51) Int. Cl.$^7$ .............................................. H01L 23/24
(52) U.S. Cl. ...................................... 257/687; 438/106
(58) Field of Search .................. 438/106–110, 125–127; 257/687–688, 777

(56) References Cited

U.S. PATENT DOCUMENTS 5,375,042 A * 12/1994 Arima et al. ............... 361/784
6,075,289 A * 6/2000 Distefano ................... 257/732

* cited by examiner

*Primary Examiner*—David Nelms
*Assistant Examiner*—David Vu
(74) *Attorney, Agent, or Firm*—Lerner, David, Littenberg, Krumholz & Mentlik, LLP (57) ABSTRACT

A method of manufacturing a plurality of microelectronic packages including electrically and/or thermally conductive elements. The method includes providing a support structure having a plurality of protrusions and depressions extending outwardly from the support. A conductive element is then mated to the support structure in a male-to-female relationship. The depressions formed in the support structure and conductive element are used to house a microelectronic element such as a semiconductor chip. A substrate is provided so as to cover substantially each depression located in the conductive element. Leads interconnect contacts to the chip to terminals on the substrate. A curable encapsulant material may be deposited into the depression so as to protect and support the leads and the microelectronic element. Additionally, the curable encapsulant material forms part of the exterior of a single resulting chip package once the assembly is diced and cut into individual packages.

7 Claims, 12 Drawing Sheets

METHODS OF MAKING MICROELECTRONIC PACKAGES INCLUDING ELECTRICALLY AND/OR THERMALLY CONDUCTIVE ELEMENT

CROSS-REFERENCE TO RELATED APPLICATIONS

This application claims benefit of U.S. Provisional Application No. 60/391,814 filed on Jun. 27, 2002, the disclosure of which is incorporated by reference herein.

BACKGROUND OF THE INVENTION

The present invention relates to methods of making microelectronic assemblies, such as semiconductor chip packages, including an electrically and/or thermally conductive element.

Modern electronic devices utilize semiconductor chips, commonly referred to as "integrated circuits", which incorporate numerous electronic elements. These chips are mounted on substrates that physically support the chips and electrically interconnect each chip with other elements of a circuit. The substrate may be a part of a chip package including terminals for interconnecting the chip with external circuit elements. The interconnection between the chip and its supporting substrate is commonly referred to as a "first level" interconnection. The interconnection between the substrate and the larger elements of the circuit is commonly referred to as a "second level" interconnection.

A plurality of semiconductor chips may be assembled with a substantially continuous strip, as disclosed in certain embodiments of WO 94/03036, the disclosure of which is hereby incorporated by reference herein. The strip may have a plurality of sprocket holes for advancing the strip in a direction for assembly with semiconductor chips. The strip has leads connected to terminals on a surface of the strip that faces away from the chips. The strip includes apertures aligned with the leads. The strip is disposed on top of the chips so that the leads generally extend over the contacts of the chips. A bonding tool is utilized to bond each lead to a contact, by advancing the tool toward a lead and forcing the lead toward the contact on the chip. Heat and/or ultrasonic vibration is applied to the lead by the tool so as to bond the lead to the contact. Alternatively, a wafer incorporating a plurality of chips is assembled with a sheet incorporating a plurality of interposers. The wafer and sheet are severed to provide individual packages.

After forming semiconductor chip packages, the individual packages may be assembled with an electrically or thermally conductive element. A thermal or electrical connection is formed between the element and external circuit elements for shielding or heat spreading. Assembling such individual elements, commonly known as "cans", with each semiconductor chip is costly and time-consuming.

Despite the foregoing improvements, further advancement in making microelectronic assemblies is desirable.

SUMMARY OF THE INVENTION

The present invention addresses these needs.

In a first aspect of the present application, a method of making a microelectronic package comprises providing a plurality of microelectronic packages, providing a support having a plurality of recesses, the support carrying a conductive element having a plurality of depressions, at least some of the depressions being disposed in a recess. The conductive element is assembled with the microelectronic packages. Most preferably, the support is removed after this assembly step, and the conductive element is severed between at least some of the depressions to form individual assemblies each including one or more microelectronic packages with a portion of the conductive element as a conductive shell or shield at least partially encompassing the package or packages. In assembling a plurality of packages with a conductive element and then severing the conductive element, a plurality of separate conductive elements need not be assembled with each package. The conductive element may comprise a thermally conductive element to form a thermal heat spreader, or the conductive element may comprise an electrically conductive element for forming shields, or both.

The support may comprise a mandrel having a plurality of recesses corresponding to the depressions in the conductive element. The step of providing a support may comprise depositing a conductive material on a surface of the support. In preferred embodiments, the surface of the support comprises a material that does not adhere to the conductive material deposited thereon. The support, for example, may comprise molybdenum, steel, brass or chromium. The conductive material may comprise a material such as copper, nickel or gold.

In certain preferred embodiments, each package comprises a semiconductor chip attached to a dielectric layer and has leads connected to the chip and to terminals on the dielectric layer. Bonding material as, for example, a solder, may be applied to the terminals on the package, for connection to external elements such as contact pads on a circuit board. The microelectronic package may also include one or more conductive planes that may be connected to other elements using bonding material. Further, bonding material may be applied to the conductive element before or after the severing step so that the shell formed from the conductive element also may be connected to the circuit board.

In preferred embodiments, a flowable material is introduced in the depressions to encapsulate the elements of the packages disposed within the depressions. In embodiments in which the package includes leads, the flowable material is introduced so as to surround the leads. Desirably, the conductive element comprises a recession or hole that communicates between depressions. Such recession or hole is desirably arranged so that the flowable material can flow between adjacent depressions. For example, the side walls forming boundaries between adjacent depressions can be formed as a plurality of spaced pillars with gaps therebetween.

The conductive element, in certain preferred embodiments, has protruding portions or bumps adjacent each depression so that the protruding portions are disposed adjacent each package when the conductive element is assembled with the microelectronic packages. In certain preferred embodiments, the packages comprise a tape or strip assembled with a plurality of semiconductor chips and the tape or strip has holes between each semiconductor chip. The holes may be shaped, sized and arranged to receive the bumps of the conductive elements.

Yet another aspect of the invention provides microelectronic assemblies which desirably include a conductive element including a bottom wall and a plurality of side walls extending from said bottom wall so that said bottom wall and said side walls define a depression, said conductive element having one or more additional openings therein. The assembly; desirably includes a dielectric layer extending between the side walls, so that said dielectric layer and the conductive element substantially enclose an interior space within the depression. The one or more openings in the conductive element communicate with the interior space.

A microelectronic element is disposed within the space. An encapsulant includes an interior portion at least partially filling the space and at least partially surrounding the microelectronic element, and an exterior portion being disposed outside of said interior space in contact with the conductive element, said portions of said encapsulant being connected to one another through said one or more openings in the conductive element. Stated another way, in this aspect of the invention, portions of the encapsulant are exposed at the exterior of the assembly, desirably along the side walls of the conductive element. For example, where the conductive element includes multiple pillars defining the side walls, portions of the encapsulant fill the gaps in the side walls so that these portions are exposed at the outside of the assembly. Thus, even where the conductive element does not provide a complete, continuous covering over the microelectronic element, the encapsulant fills the gaps. The encapsulant exposed at the exterior of the assembly may also serve to protect the conductive element from mechanical damage.

BRIEF DESCRIPTION OF THE DRAWINGS

These and other features, aspects and advantages of the present invention will become better understood with regard to the following description, appended claims, and accompanying drawings where:

DETAILED DESCRIPTION

Figure 1:
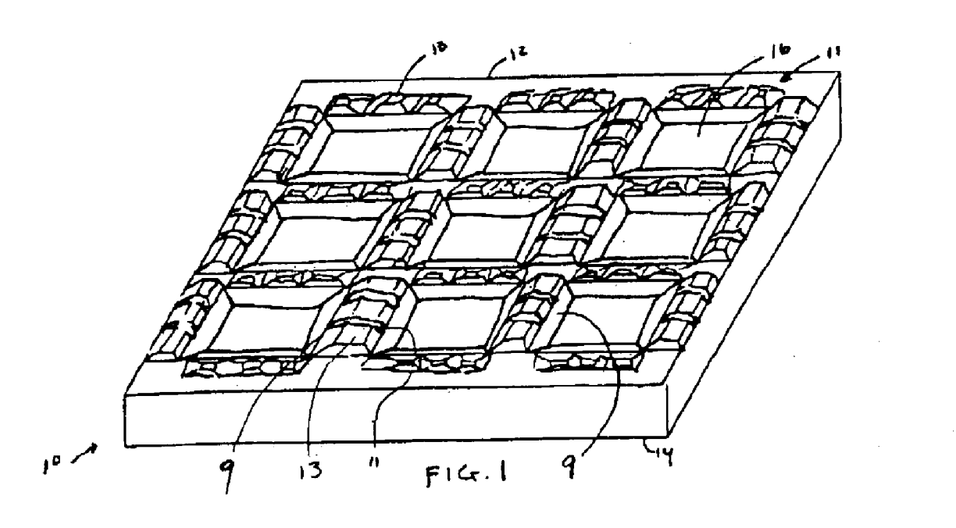
FIG. 1 is a perspective view of a support used in a method in accordance with an embodiment of the invention.

A method in accordance with one embodiment of the invention includes using a support 10. Support 10 comprises an element having a first major surface 12 and a second major surface 14 facing oppositely from the first major surface 12. Recesses 16 are formed in the first major surface 12 of the support 10. The support has surface portions 11 surrounding each recess 16 and projecting upwardly from the bottom surface of the recess. In this embodiment, each surface portion 11 is in the form of a substantially continuous wall extending along one side of a recess or forming a division between two adjacent recesses. Each surface portion or wall 11 has outwardly-sloping surfaces extending from the top of the wall to the bottom surface of each adjacent recess, so that each wall widens toward the bottom of the recess whereas each recess widens toward the top or open side of the recess. Each surface portion or wall 11 has a set of spaced apart support protrusions or bumps 13 disposed along the length of the wall. Bumps 13 project upwardly from the top surface of the wall. Each support protrusion or bump 13 may have the shape of a pyramid, a cone, an elongate protruding element, or any other shape.

The recesses 16 and other features of the support 10 may be formed by machining, by casting, by molding, or by providing a sheet and etching the first major surface 12 of the sheet to form the features discussed above. The support may comprise a metal or a polymer, and may be rigid or flexible.

Figure 2:
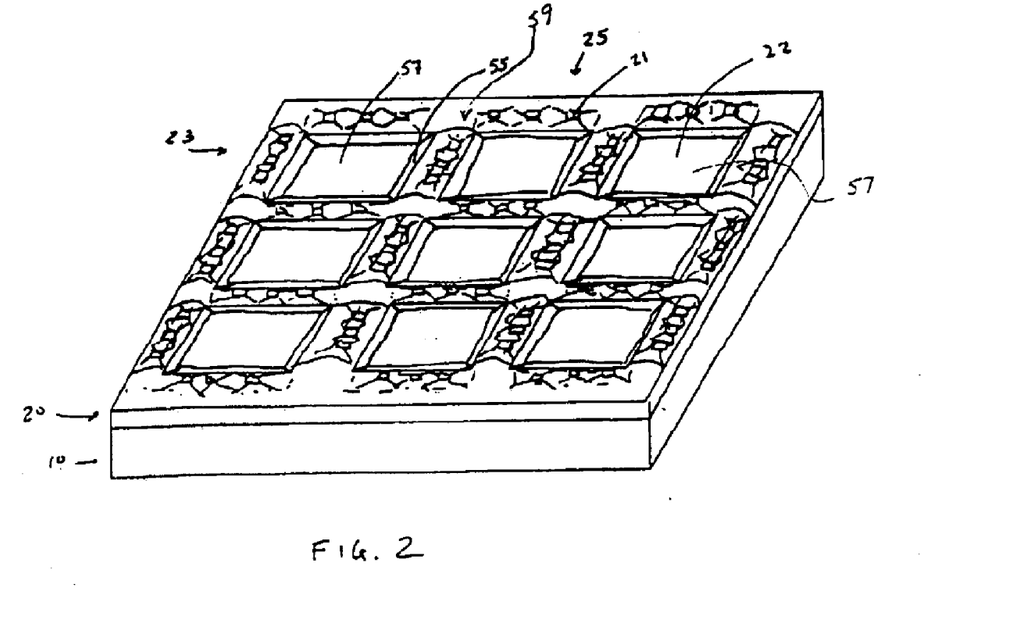
FIG. 2 is a perspective view of the support of FIG. 1 at a later stage in a method in accordance with the embodiment of FIG. 1.

A conductive element 20 having depressions 22 is provided on the support 10, as shown in FIG. 2, most preferably by forming the conductive element as a layer of conductive material overlying the top surface of the support so that the shape of conductive element 20 conforms to the shape of the support top surface 12. Thus, the conductive element 20 has depressions 22 corresponding to the recesses in the support surface, each such depression having a bottom wall 57 and side walls 59 projecting upwardly from the bottom wall around the periphery of each depression. The side walls 59 correspond to walls 11 (FIG. 1) of the support, and form borders between adjacent depressions 22. The side walls 59 have sloping wall portions 55. Each side wall 59 has spaced-apart protruding portions or bumps 21 projecting upwardly from the top of the side wall. Bumps 21 correspond to the support protrusions or bumps 13.

The conductive element 20 may be formed on the support 10 by depositing a layer of conductive material on the first major surface 12 of the support. For example, metal may be deposited on the first major surface 12 until a layer of metal having depressions 22 is formed on the support 10. Where the support is formed from an electrically conductive material, the metal can be electroplated directly on the support. Alternatively, where the support is formed from a nonconductive material, a thin conductive layer may be deposited on the support by sputtering, electroplating, evaporation or chemical vapor deposition, whereupon additional metal can be deposited on the conductive layer by electroplating.

The conductive element 20 may also be formed by placing a metal sheet over the first major surface 12 and pressing the metal sheet against the recesses 16 so as to form the depressions 22 in the, recesses 16 of the support 10. For example, the support 10 and metal sheet may be placed in a press having a compliant pad, such as a rubber sheet, on one side with the support 10 on the other side, and the metal sheet can be squeezed between the support 10 and the compliant pad. In another example, the metal sheet can be squeezed in a press between the support and a mating female die, i.e., a die having a shape substantially complementary to the shape of support top surface 12.

Desirably, the depressions 22 closely conform to the recesses 16 in the support 10 so that the support 10 can be engaged and moved and the conductive element 20 will be carried on the support 10. Although the support 10, recesses 16, conductive element 20, support protrusions 13, protruding portions 21, and depressions 22 have rectangular shapes in FIGS. 1–7, these features may have any regular or irregular shape. The designations "top" and "bottom" are used for convenience and do not refer to any gravitational frame of reference.

Preferably, the support 10 comprises a material, at least at the first major surface 12, that does not adhere to the conductive element 20 formed on the support. In a preferred embodiment, the support comprises a metal, such as molybdenum, steel, or brass and has a coating of chromium. In embodiments including a coating on the support, the coating is preferably applied after the recesses and other features of the support surface 12 are formed.

Figure 3:
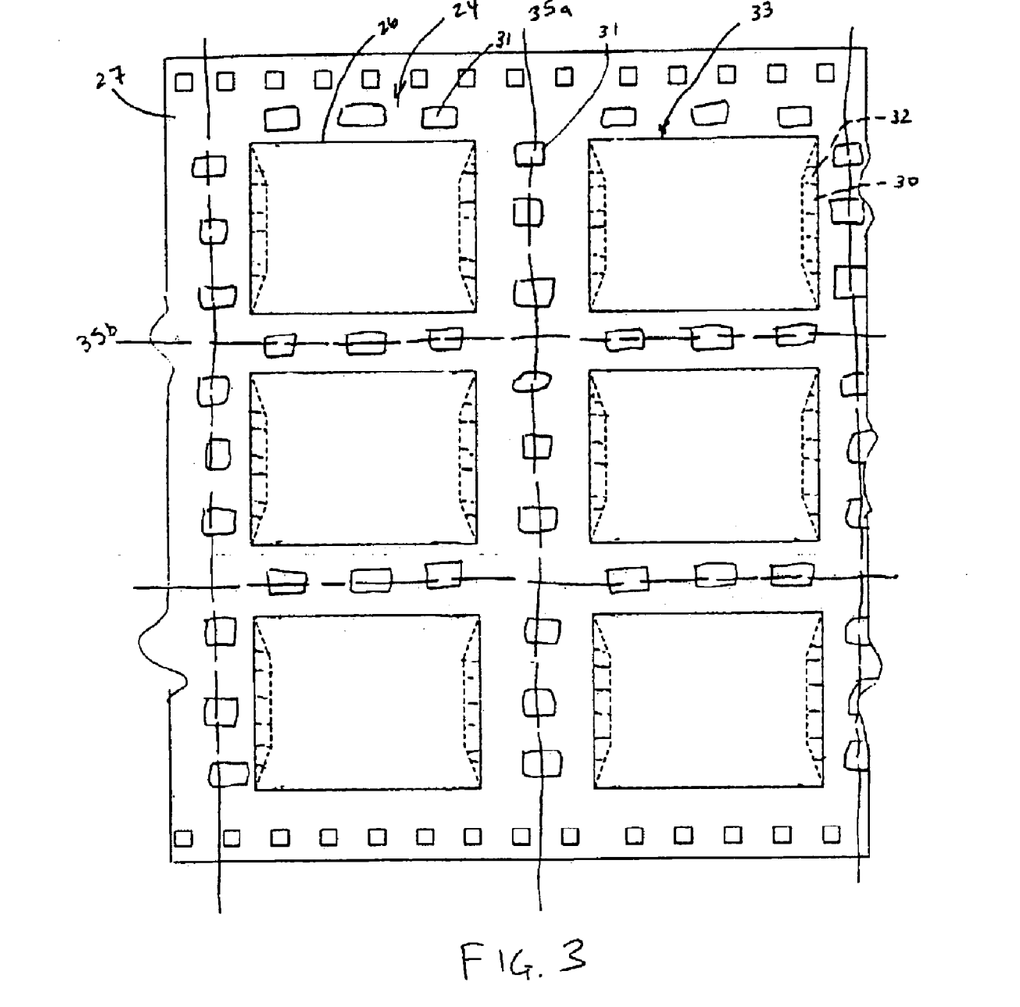
FIG. 3 is a bottom plan view of a microelectronic package used in a method in accordance with the embodiment of FIGS. 1–2.
Figure 4:
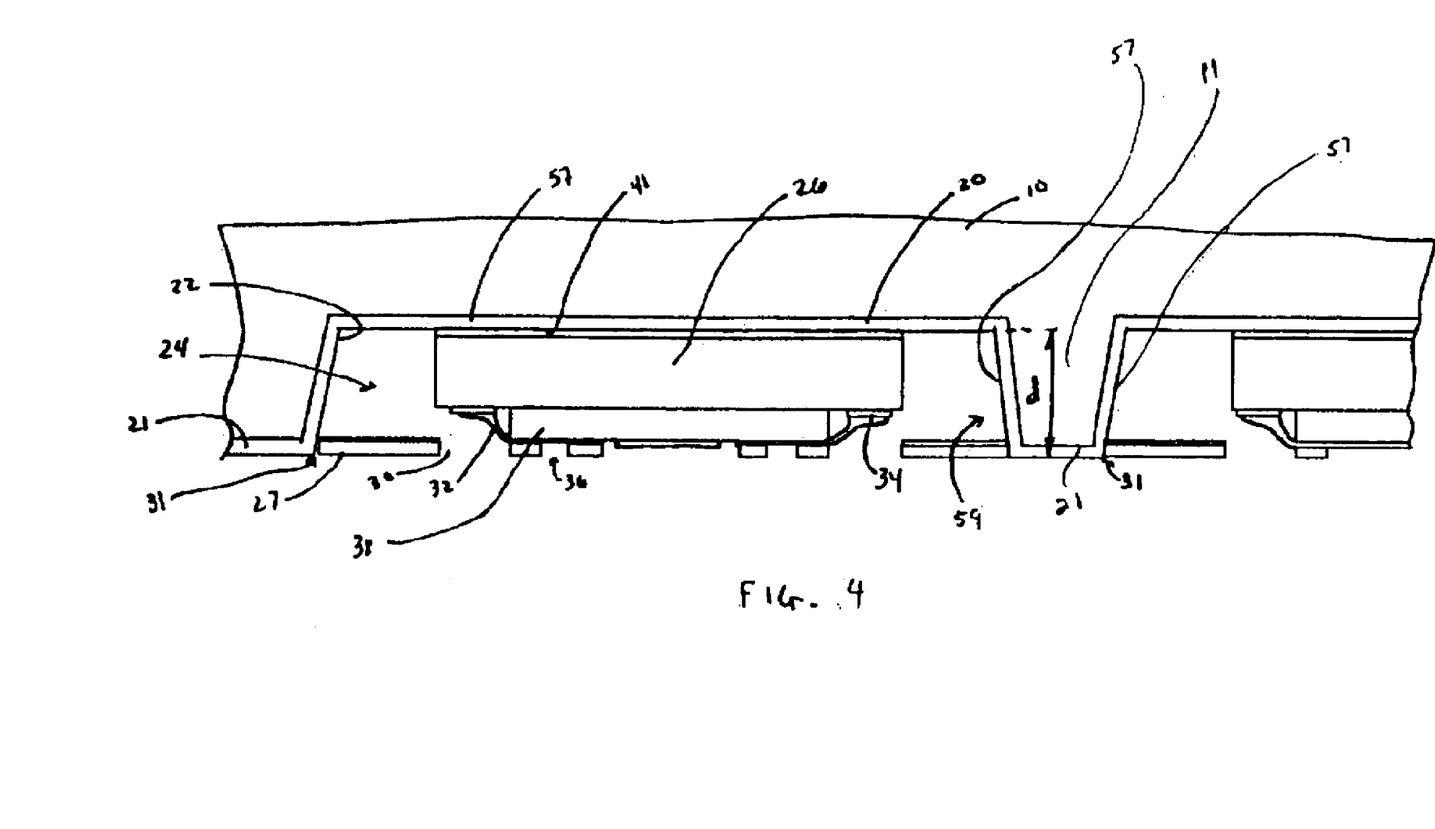
FIG. 4 is a cross-sectional view of the support of FIG. 2 engaged with the package of FIG. 3.
Figure 5:
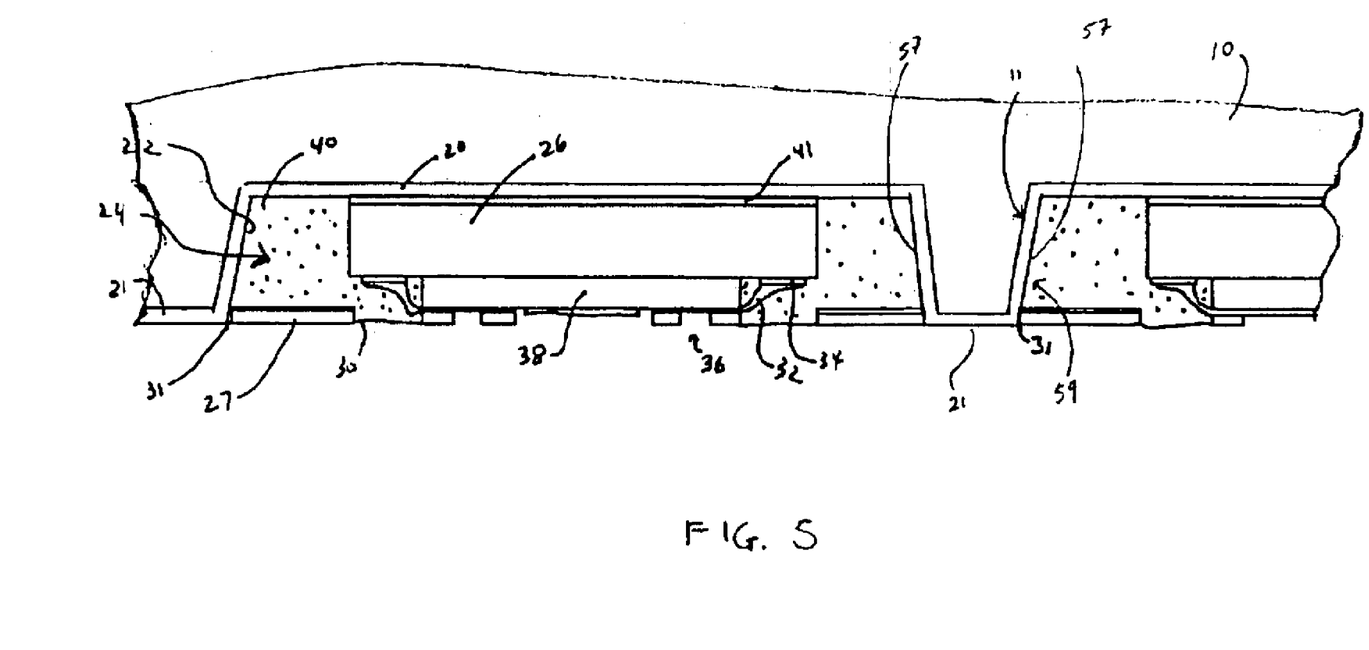
FIG. 5 is view similar to FIG. 4 but depicting the support and package at a later stage in the method.
Figure 6:
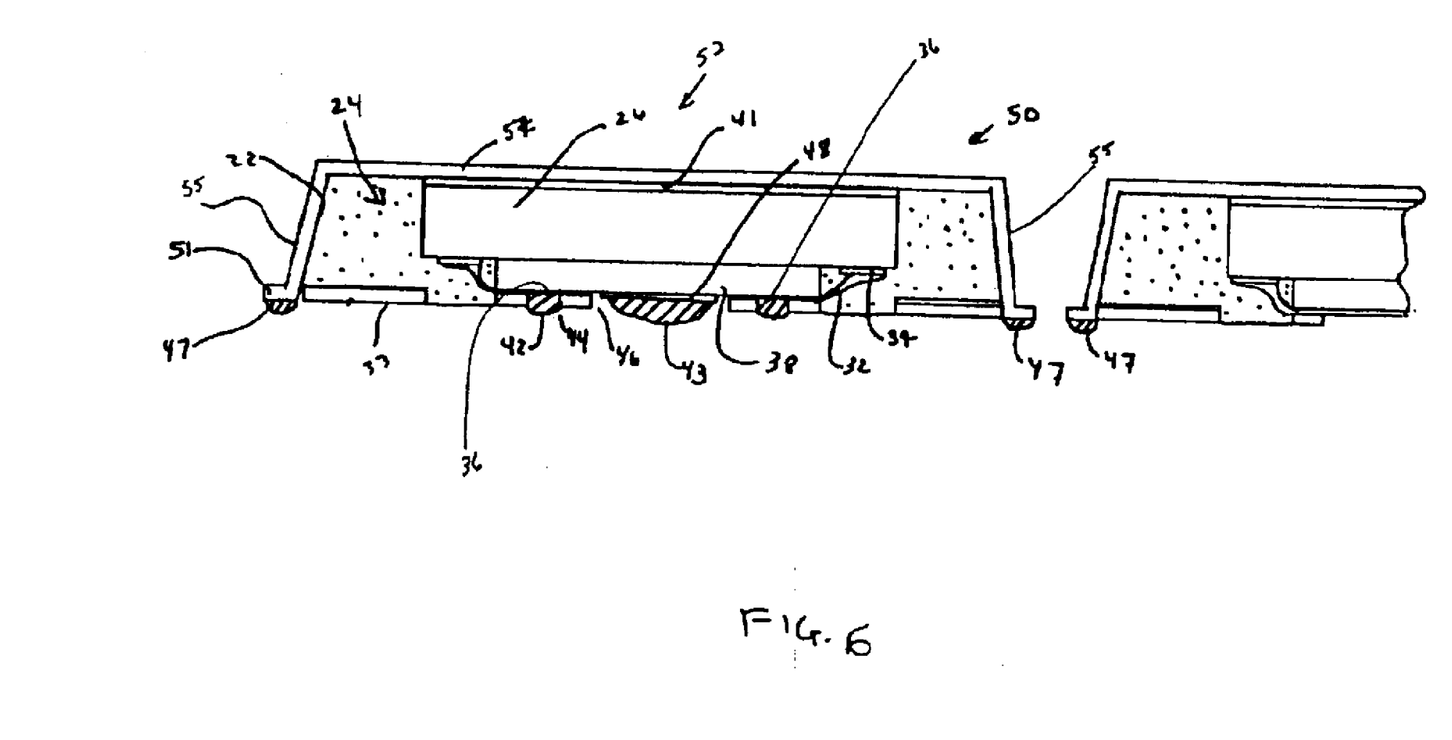
FIG. 6 is a cross-sectional view of packages formed in the method of FIGS. 1–5.

A plurality of microelectronic packages 24 is provided. Each of the packages 24 shown in FIGS. 3 and 4 comprises a microelectronic element 26, such as a semiconductor chip and a region 33 of a dielectric layer 27. As used herein, the term "microelectronic element" comprises a semiconductor chip, a printed circuit board, a wafer or stacked assembly incorporating a plurality of semiconductor chips, or any other microelectronic element. In the embodiment shown in FIG. 3, the dielectric layer regions 33 associated with numerous packages 24 are provided as parts of a unitary strip 27 of dielectric material. The strip 27 has a region 33 corresponding to each microelectronic element. Each region 33 has a plurality of leads 32 arranged with apertures 30, also referred to herein as bond windows. The bond windows 30 provide access to the leads 32 so that they can be bonded to contacts 34 on the microelectronic element 26. Terminal structures 36 on each region 33 of the strip 27, as shown in FIG. 4, are connected to the leads 32. The terminal structures are exposed at an outer surface of the dielectric layer or strip 27, i.e., the surface facing away from microelectronic elements 26. The terminal structures may be flush with the outer surface, recessed relative to the outer surface, or project from the outer surface. In the particular embodiment depicted in the drawings, terminal structures 36 lie on the inner surface of the dielectric layer (the surface facing toward microelectronic elements 26) and are exposed at the outer surface through holes in the dielectric layer aligned with the terminal structures. As further discussed below, the terminal structures will be used to provide connections to external circuitry, such as a printed circuit board or other microelectronic element. In the particular embodiment depicted, each package 24 includes a compliant layer 38 between the strip 27 and the microelectronic element 26 and the leads 32 are disposed between the strip and the compliant layer 38. The compliant layer 38 is best seen in FIGS. 4–6. During manufacture of the packages 24, the leads and terminal structures on the dielectric elements shown in FIGS. 3–6 may be connected to microelectronic elements 26 using a lead-bonding process according to certain embodiments of International Patent Publication WO 94/03036, the disclosure of which is hereby incorporated by reference herein. In other embodiments, the terminal structures on the dielectric elements may be connected to microelectric elements 26 by wire-bonding.

The strip 27 shown in FIGS. 3–6 also has a central hole 46 as shown in FIG. 6, in each region 33 and a thermally conductive plane as, for example, a metallic plane 48 is accessible through the central hole 46.

The strip 27 preferably includes holes 31 separating each region 33, in between the individual packages 24. The holes 31 are arranged in a pattern corresponding to the pattern of protruding portions or bumps 21 on conductive element 20. Preferably, the holes 31 have a shape for engaging the protruding portions 21.

In the assembly method, the support 10 and conductive element 20 are juxtaposed with the plurality of microelectronic packages 24 so that the conductive element faces the packages 24 and each package 24 is aligned with a depression 22 in the conductive element 20. The inner side of the dielectric layer, bearing the microelectronic elements faces toward conductive element 20. The support 10 and packages 24 are moved in relation to one another so that a surface of each package 24 touches a surface of the conductive element 20 within a depression 22 and so that the protruding portions or bumps 21 of the conductive element are received in the holes 31 in the strip. In the embodiment shown, a rear surface of the microelectronic element or chip 26 is brought into contact with the bottom wall 57. The holes 31 aid in registration of the plurality of packages with the conductive element. Moreover, the support 10 reinforces the conductive element during the assembly process so that the conductive element does not bend or otherwise distort during this step. This further aids in registration of the conductive element with the packages.

The packages 24 may be oriented so that the rear surface of the microelectronic element 26 faces upwardly and the support 10 may be oriented so that the conductive element 20 faces downwardly toward the packages 24, as shown in FIG. 5. However, the orientation of the support 10 and microelectronic element 26 relative to gravity is in no way essential to the invention. The packages may be assembled with the conductive element utilizing robotic equipment, computer controllers, optical systems, and any other equipment used in the microelectronic arts.

As best appreciated with reference to FIG. 2, the conductive element 20 defines several rows 23 and columns 25 of depressions 22. A strip 27 having a corresponding number of rows and columns of packages 24 is desirably used with the support 10 and conductive element 20. In other embodiments, a plurality of strips 27, may be assembled with the conductive element 20 so that a strip 27 corresponds to a row 23 of depressions 22. In other embodiments, the conductive element 20 may comprise a single row of depressions 22 for assembly with a single strip 27. In other embodiments, the strip may comprise a sheet incorporating packages 24 arranged in a two-dimensional array other than the specific array shown in FIG. 3.

After assembly of the packages with the conductive element, a flowable material 40 is introduced into the space between the conductive element 20 and the dielectric component 27, so that the leads 32 and the microelectronic element 26 are surrounded by the flowable material 40. The flowable material may be inserted into depressions 22 via any open area of depression 22 not covered by strip 27. For example, the bond windows 30 can be used for this purpose. In an alternate embodiment not shown, strip 27 may be provided with apertures remote from the bond windows for permitting introduction of flowable material 40 into depression 22. The flowable material may be introduced into the various depressions 22 of conductive element 20 either simultaneously or sequentially. Merely by way of example, the flowable material may be introduced by conventional dispensing equipment using a needle (not shown) aligned with an opening in the strip at each depression. The flowable material also adheres the microelectronic element 26 to the conductive element 20. In a further variant, a layer of a thermally-conductive material such as a grease, gel or curable adhesive composition loaded with a thermally-conductive filler may be provided between the rear surfaces of each microelectronic element and the bottom surface 57 of each depression. For example, the thermally-conductive material may be applied to the rear surfaces of the microelectronic elements or to the bottom surfaces of the depressions before assembling the packages with the conductive element.

The support 10 is removed after the packages 24 are adhered to the conductive element 20. The conductive element 20 releases from the support 10, as the conductive element 20 is not adhered thereto. The fit of the conductive element 20 in the recesses 16 is overcome by the adhesion between the packages 24 and the conductive element 20. The cured flowable material desirably contributes to the adhesion between the packages and the conductive element. The sloping wall portions 55 of the conductive element 20 may be arranged to facilitate the release of the conductive element 20 from the support 10.

Conductive features such as masses of an electrically conductive bonding material as, for example, a solder, may be added to the dielectric layer, in contact with the terminal structures, so that the packages 24 can be interconnected with external circuitry. As shown in FIG. 6, first conductive features 42 are added on the terminal structures 36. Second conductive features 43 are placed in the central holes 46 in contact with the conductive planes 48. Third conductive features 47 are disposed on the bumps or protruding portions 21 of the conductive element 20.

The packages 24 are diced into individual assemblies 50 by severing the conductive element 20 and strip 27, at the middle of each wall 59 between adjacent depressions 22, so that the strip and conductive element are severed along lines 35 shown in FIG. 3. After dicing, each assembly 50 includes a package 24, with the microelectronic element 26 and with a portion 33 of the dielectric layer, together with an individual element 52 formed from a portion of the conductive element 20. Thus, the conductive element 20 and strip 27 are severed along lines 35a cutting through rows of packages, and along lines 35b cutting through columns of packages, as best seen in FIG. 3. In this arrangement, the conductive element 20 is severed through the protruding portions or bumps 21. Thus, each wall 59 provided in the original conductive element 20 is severed to leave one sloping wall portion 55 of the conductive element as a side wall along one side of the assembly, and each bump 21 of the conductive element is severed to form a tab 51 at an edge of such side wall or sloping wall portion 57. Preferably, the process of placing the third conductive features 47 on the bumps and the severing process are conducted so that after the severing process, the third conductive features 47 remain on all of the bumps. For example, pairs of conductive features 47 may be added to each bump 21 and the each bump 21 may be severed between the conductive features 47 of the pair. Alternatively, the third conductive features may be provided as masses of solder covering the entire exposed surface of each bump 21, and these masses may be severed into smaller masses when the conductive element is severed. In a further alternative, the conductive features may be added after the severing operation.

The dicing or severing operating may be performed by utilizing a blade or a laser or any other means of cutting through the conductive element 20 and strip 27. Preferably, the dicing or severing operation is performed after the support 10 has been removed. In an alternative, the support can be severed along with the conductive element and strip, so that a portion of the support remains in place on each assembly after the severing step. These portions of the support can be removed after severing. The step of adding the conductive features can be performed before or after the severing step, and before or after removing the support.

Each finished assembly includes an individual element or electrically conductive shield 52 formed by a portion of the conductive element 20 having one depression 22. The wall 57 which originally constituted the bottom wall of the depression forms a wall of the shield whereas sloping side walls 55 form walls of the shield projecting from wall 57 to the vicinity of the dielectric element 33. Each wall 57 has a tabs 51 at its edge remote from wall 57.

In use, the finished assembly can be bonded to a circuit board. The first conductive elements or bonding material 42 serves to connect terminal structures 36 to contact pads of the circuit board. The third conductive element or bonding material 47 can connect tabs 51, and hence the conductive shell, to a mating conductive feature on the circuit board. This connection can be used to carry a voltage such as ground potential to the shell, to conduct heat from the shell to the circuit board, or both. Thus, the individual element 52 comprises a heat spreader, or an electromagnetic shield for the package 24. The second conductive element 43 can connect the metallic plate 48 to a mating metallic or other thermally conductive feature on the circuit board, and may also form an electrical ground or other electrical connection. These features of the finished assembly and its use with a circuit board may be in accordance with copending, commonly assigned U.S. patent application Ser. No. 10/210,160 and copending, commonly assigned PCT International Application U.S. Ser. No. 02/27,509, the disclosures of which are hereby incorporated by reference herein.

In other embodiments, an adhesive 41 may be disposed on the surface of the conductive element 20 in the depressions 22, on the package 24, or both, before the microelectronic element 26 is brought into contact with the conductive element 20. The adhesive may be thermally conductive, electrically conductive or both. In other preferred embodiments, the conductive element 20 is attached to another part of the microelectronic package 24, such as the upper surface of the microelectronic element 26 or the dielectric layer 27.

The flowable material may comprise a curable dielectric material. In addition, certain embodiments of U.S. Pat. Nos. 6,329,224, 6,359,335, 6,232,152, and 5,776,796, the disclosures of which are hereby incorporated by reference herein, may be used. Desirably, the conductive element 20 comprises a recession or hole that communicates between depressions. Such recession or hole is desirably arranged so that the flowable material can flow between adjacent depressions.

Figure 6A:
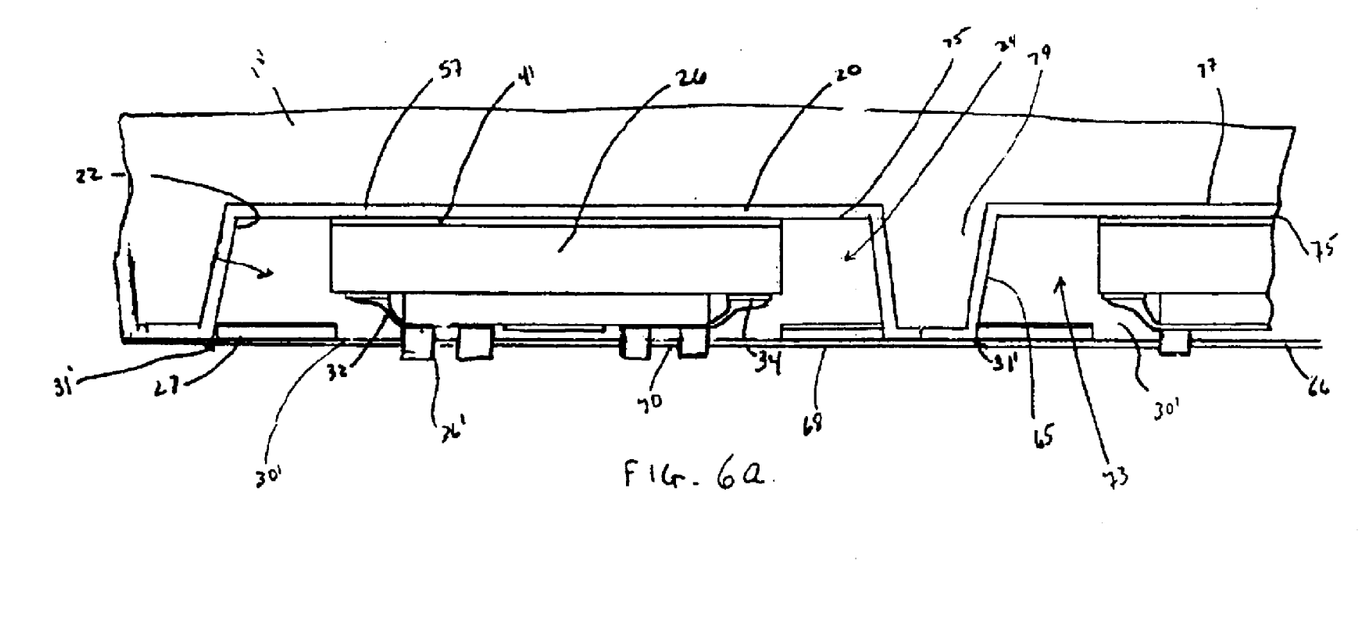
FIG. 6A is a cross-sectional view of packages formed in the method of FIGS. 1–5.
Figure 6B:
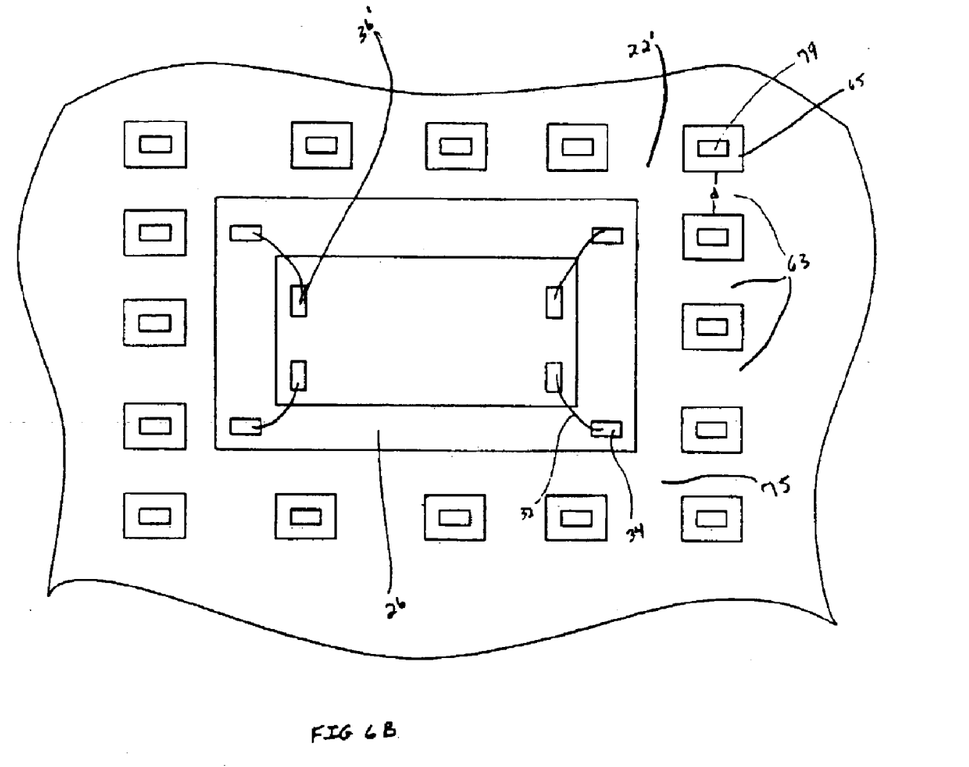
FIG. 6B is a bottom view of a package formed in the method of FIGS. 1–5.

An example of such a recession of hole is used in the method shown in FIGS. 6A and 6B. In this method, support 10' is provided with rows of projecting posts 79 projecting upwardly from a generally planar bottom surface 77. Here again, the conductive element 20' is provided as a layer of conductive material such as a metal closely overlying and conforming to support 10', preferably by forming the conductive element on the support by the methods discussed above. Thus, the conductive element will include rows of spaced-apart protrusions or pillars 65 extending outwardly from a bottom wall 75, each such pillar being hollow and substantially surrounding one post 79 of the support. The pillars are separated from one another by gaps or recessions 63.

Thus, the conductive element includes depressions 22' surrounded by rows of projecting pillars 65, each such depression having a bottom wall constituted by a portion of bottom wall 75. The gaps or recessions 63 act as a bridge between adjacent depressions 22' or a depression 22' and the exterior of the assembly. In the assembly method, packages 24' are assembled with the conductive element in substantially the same manner as discussed above. The pillars 65 desirably project through holes 31' in the dielectric element in much the same manner as the bumps discussed above. The dielectric element includes conductive features similar to those discussed above, such as terminal structures 36' exposed at an outer surface 68 of the dielectric layer (the surface facing away from support 10' in FIG. 6A).

In this method as well, a flowable material 40' is introduced into depressions 22' after assembling the packages to the conductive element, and desirably before removing support 10'. Before introducing flowable material 40', a solder mask or coverlay 66 may be attached to outer surface 68 as taught in commonly-assigned U.S. Pat. No. 6,359,335, which is hereby incorporated by reference herein. Coverlay 66 seals the bond windows 30' in the dielectric strip. The coverlay desirably also extends over the tips of pillars 65, and seals the holes 30 in the dielectric layer which receive the pillars. In this condition, the various depressions 22' communicate with one another through the gaps 63 between the pillars, but do not communicate with the outer surface of the dielectric element. A flowable material 40' may be introduced between the dielectric strip 27' and the conductive element 20' as, for example, by injecting the dielectric material into the gaps between pillars at an edge of the assembly. The dielectric material can flow through all of the depressions 22' and disperse through the entire assembly when it is introduced. However, the flowable material will not contaminate the conductive features exposed at the outer surface of the dielectric element. In this process, the flowable material 40' will fill all of the depressions and will also fill the gaps 63 between the pillars.

In an alternate embodiment, coverlay 66 may be provided with apertures remote from the terminal structures 36', and flowable material may be introduced into one or more of the depressions 22' through these apertures. Here again, the flowable material will pass from one depression to another via gaps or recessions 63.

As shown in FIG. 6B, the pillars 65 are spaced so that gaps or recessions 63 have a dimension d large enough to permit flowable material 40' to permeate through, from one depression 24' to another. However, dimension d is small enough not to permit electromagnetic radiation wavelengths at an operating frequency associated with the microelectronic elements 26' from passing between adjacent pillars 65 during operation of the finished assemblies. Stated another way, the pillars are close enough to one another to form a Faraday shield effective to block electromagnetic radiation at an operating frequency used by the microelectronic element. To act as a Faraday shield, the dimension d of the gaps, and hence the distance between adjacent pillars, should be less than the wavelength of radiation at the operating frequency. Where the microelectronic element is a radio frequency power amplifier, the operating frequency may be taken as the carrier frequency of the signals which are to be amplified. Where the microelectronic element is a digital element such as a conventional digital semiconductor chip, the operating frequency may be taken as the clock frequency of the chip.

Figure 6C:
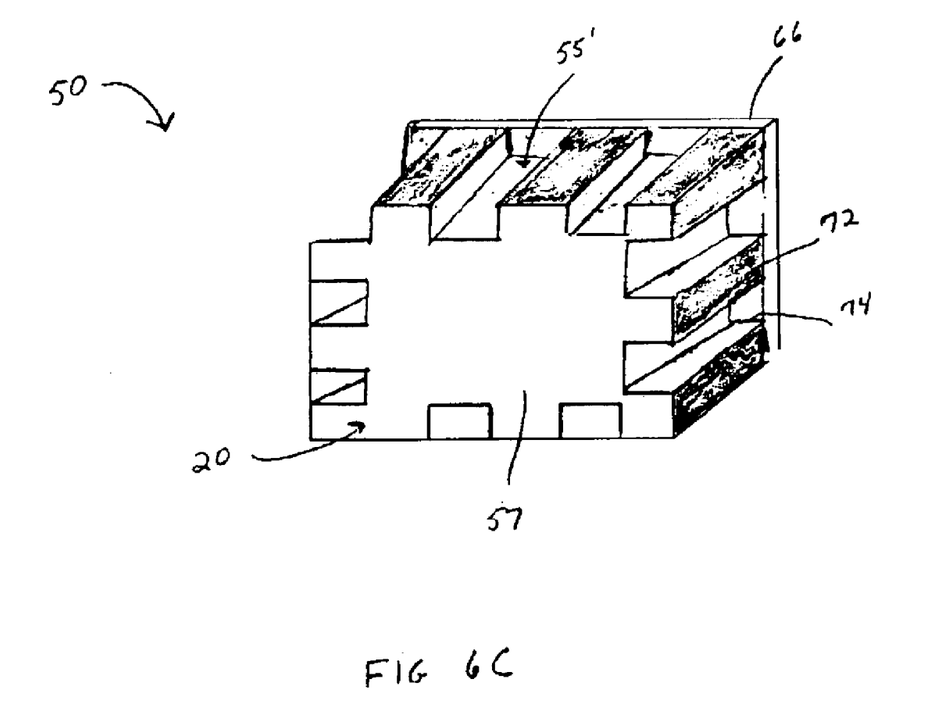
FIG. 6C is a perspective view of a package formed in the method of FIGS. 1–5.

Here again, after injection and curing of the flowable material, and desirably after removing the conductive element and strip from support 10, the conductive element and dielectric strip are severed along severance planes extending between adjacent depressions 22' to yield individual assemblies 50' (FIG. 6C).

As shown in FIG. 6C, each assembly 50' includes a conductive shell or shield including a bottom wall 57' formed from a portion of the original bottom wall 75 of the conductive element, and side walls 55' projecting upwardly from the bottom wall 57'. Each side wall 55' is formed by a plurality of conductive pillar portions 74, formed from the conductive pillars 65 of the original conductive element. Regions of cured flowable material 72 are also present at the exterior surfaces of the sidewalls 55', in the portions of the sidewalls corresponding to the gaps 63 between the posts in the original conductive element.

Figure 6D:
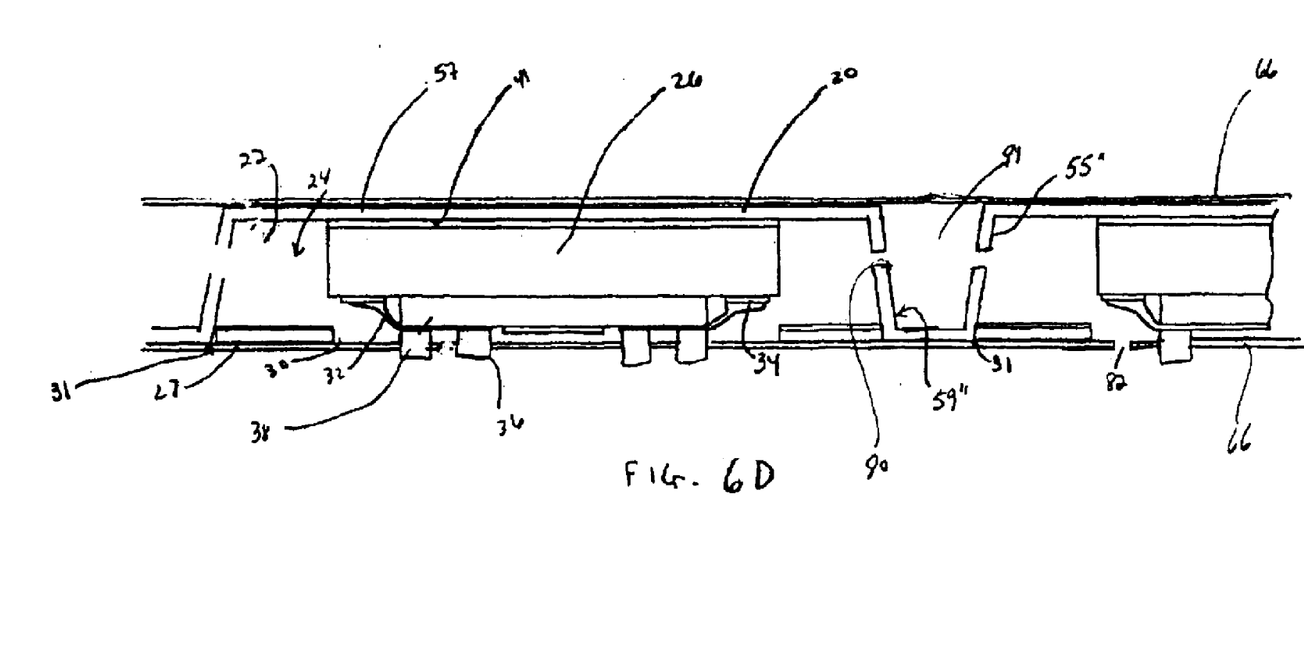
FIG. 6D is a cross-sectional view of an individual assembly formed in a method in accordance with a further embodiment of the invention.

In another embodiment of the invention, as shown in FIG. 6D, the conductive element 20" is formed with raised portions or walls 59" having substantially continuous side walls 55" and having bumps or protrusions 21" similar to the side walls and bumps of the conductive element discussed with reference to FIGS. 2–6. However, at least one passageway 80 extends through each wall 59" connecting adjacent depressions 22". As seen in FIG. 6D, each passageway 80 includes a portion extending through one side wall 55" of a hollow wall 59" defining a wall space 81 open toward the rear surface of the conductive element, i.e., toward the top of the drawing in FIG. 6D. Each passageway 80 also includes a further portion extending through the opposite side wall of the same hollow wall 59", so that the depressions 22" communicate with one another through the wall space 81 within the wall. According to this embodiment, the support is removed before flowable material 40" is introduced. Coverlay 66" is applied to both the front surface 68 of the structure (the outer surface of the dielectric layer) and rear surface 69 of the structure (defined by the outwardly facing surfaces of the depression bottom walls 57"). Flowable material 40" may be introduced into the structure either by apertures 82 in conductive element 20 or through pathways 80 in walls 59" on the edges of the structure. In a further embodiment, flowable material 40" may be introduced into the structure at more than one location simultaneously. Pathways 80, similar to recessions 63 discussed above with reference to FIGS. 6A–6B, enable flowable material 40" to permeate from one depression 22" to another.

As previously mentioned coverlay 66" on front surface 68 seals the bond windows and other openings in the dielectric layer. Additionally the coverlay 66" on rear surface 69 of assembly 50 prevents flowable material passing through the wall spaces within the hollow walls 59" from leaking onto the rear surface of the structure. The rear or outwardly-facing surfaces of depression bottom walls 57" remain substantially free of the flowable material. In use of the completed assemblies, this surface may be connected to a heat sink or thermal spreader without an insulative material impeding the dissipation of heat from the chip.

Preferably, pathways 80 are sized so as to permit flowable material 40" to pass through the structure but are also sized so as not to permit wavelengths of electromagnetic radiation at an operating frequency to pass.

Figures 7, 8:
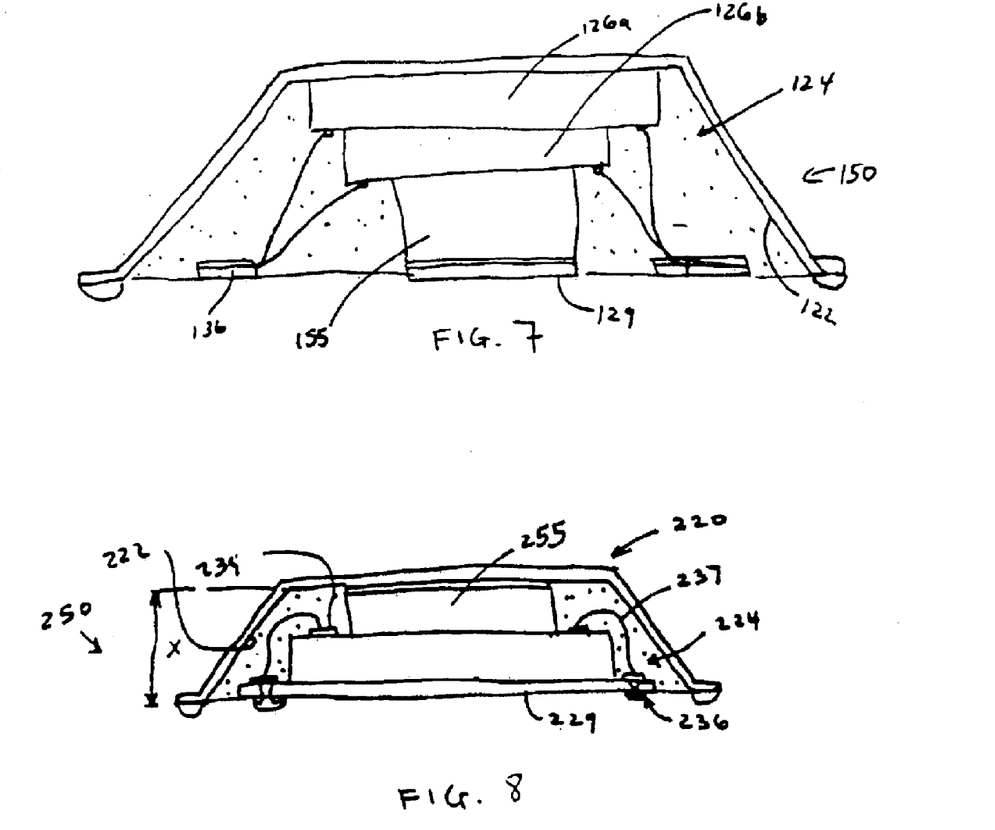
FIG. 7 is a cross-sectional view of an individual assembly formed in a method in accordance with a further embodiment of the present invention.
FIG. 8 is a cross-sectional view of an individual assembly formed in a method in accordance with another embodiment of the invention.

In another embodiment of the invention, as shown in FIG. 7, a plurality of stacks 124 of microelectronic elements are assembled in the depressions 122 of a conductive element. The stack 124 may be assembled with a compliant layer 155, or another pad of dielectric material and a dielectric layer 129. The dielectric layer 129 may comprise a strip, as discussed above or may be provided in other forms. Contacts of the microelectronic elements 126a and 126b are connected to terminal structures 136 on the dielectric layer 129. The dielectric layer 129 and conductive element are severed to form individual assemblies 150, each having one or more stacks 124 disposed in a depression 122.

In another embodiment, the packages 224 each comprise a semiconductor chip with contacts that face away from the dielectric layer, as shown in FIG. 8. The conductive element 220 is assembled with the plurality of packages 224 so that the conductive element 220 overlies the surface of the chip having the contacts 234. The contacts 234 may be attached to terminal structures 236 on the dielectric layer 229 using wire bonds 237. The conductive element 220 is placed over the upper surface of the microelectronic element with enough clearance so as to avoid interfering with the wire bonds 237. For example, the depression 222 in the conductive element 220 has a depth "x" greater than the height of the package 224 and wire bonds. In other embodiments, standoff is provided using a pad 255, disposed on the microelectronic element and the conductive element 220 is attached to the pad. The dielectric layer 229 and conductive element 220 are severed to form individual assemblies 250 in substantially the same manner as discussed above.

Figure 9:
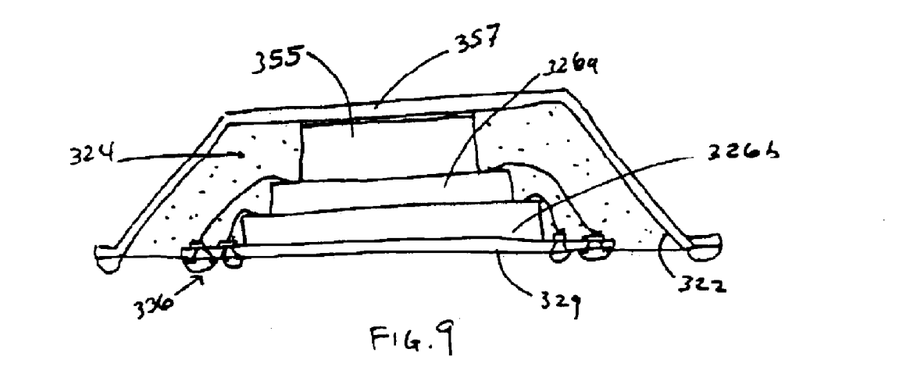
FIG. 9 is a cross-sectional view of an individual assembly formed in a method in accordance with yet another embodiment of the invention.

In another embodiment, a plurality of stacks 324 are disposed in depressions 422 of a conductive element, as shown in FIG. 9. The conductive element is assembled with the stack 324 so that contacts on a face of one of the microelectronic elements 326 faces the bottom 357 of the depression 322. A pad 355 may be disposed between the microelectronic element 326a and the bottom 357. Contacts on the microelectronic element 326a and microelectronic element 326b are connected to terminal structures 336 on a dielectric layer 329.

More than one device may be assembled in each depression of the conductive element. For example, the conductive element may be assembled with a strip carrying pairs of chips or devices so that the pair of chips or devices are both disposed in a depression. In another example, one or more devices are placed in each depression. Individual devices or packages may be placed in the depression using, for example, a pick and place machine.

Figure 10:
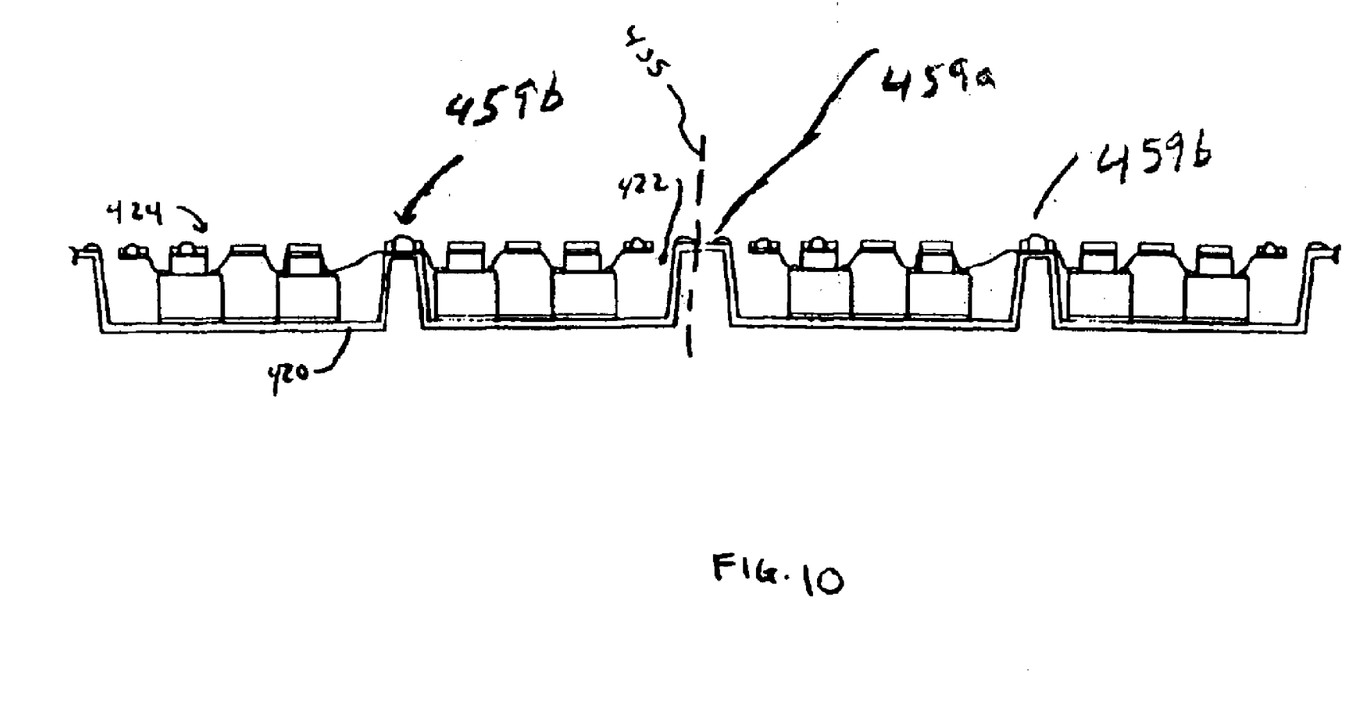
FIG. 10 is a cross-sectional, partial view of a conductive element assembled with a plurality of packages in a method according to yet another embodiment of the present invention.
Figure 11:
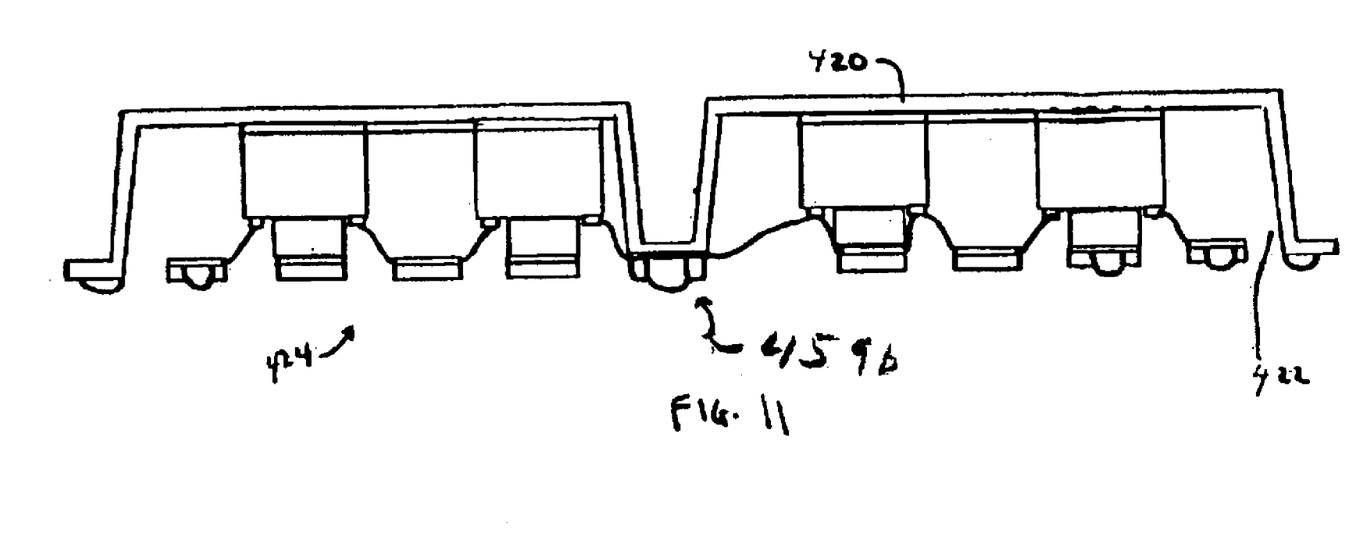
FIG. 11 is the cross-sectional view of the assembly of FIG. 10 at a later stage in the method.

In a further embodiment of the invention, as shown in FIGS. 10 and 11, the conductive element is severed at some but not all of the protruding portions. Thus, each individual assembly resulting from the severing step includes two depressions and the devices disposed in those depressions. In this embodiment, the conductive element acts as a shield to prevent electromagnetic fields from one device from propagating to the adjacent die in the same assembly. A conductive element 420 is assembled with a plurality of packages 424, as discussed above. The conductive element 420 and packages 424 may be assembled so that a single chip or other microelectronic element is disposed in a depression, or a plurality of microelectronic elements is disposed in each depression. In the embodiment shown, a pair of packages 424 are disposed in each depression 422. A flowable material is introduced around the microelectronic elements. The conductive element 420 is severed along the walls 459 so that individual assemblies 450 having a pair of depressions 422 are formed. In other embodiments, more than a pair of depressions 422 are incorporated in the individual assemblies by selecting protruding portions 421 to sever. In other words, walls 459a along a selected dicing plane 435 (FIG. 10) are severed and walls 459b are not severed.

In another embodiment of the present invention, the support and conductive element disclosed herein is used to form assemblies disclosed in certain embodiments of U.S. Provisional Application No. 60/315,408, filed Aug. 28, 2001, the disclosure of which is hereby incorporated by reference herein.

These and other variations and combinations of the features discussed above can be utilized without departing from the invention. For example, a plurality of microelectronic elements may be directly assembled with a conductive element, without being packaged with a dielectric layer. The conductive element may be assembled with other types of packages, having configurations other than the packages discussed above. A microelectronic element in a flip-chip arrangement may be used. The packages may be assembled with the conductive element by placing packages into the depressions using robotic or pick and place equipment. Devices other than microelectronic elements may be assembled with the conductive element. Active dies, passive dies, elements of a circuit other than dies, may be assembled with the conductive element. Thus, the foregoing description of the preferred embodiments should be taken by way of illustration rather than by way of limitation of the invention as defined by the claims.

What is claimed is:

1. A microelectronic assembly comprising:

(a) a conductive element including a bottom wall and a plurality of side walls extending from said bottom wall so that said bottom wall and said side walls define a depression, said conductive element having one or more additionl openings in at least one of said walls;

(b) a dielectric layer extending between said side walls, so that said dielectric layer and said conductive element substantially enclose an interior space within said depression and said one or more openings in said conductive element communicate with said interior space;

(c) a microelectronic element disposed within said interior space; and (d) an encapsulant including an interior portion at least partially filling said interior space an at least partially surrounding said microelectronic element within said space, and an exterior portion exposed at an exterior surface of said conductive element in contact with said conductive element, said portions of said encapsulant being connected to one another through said one or more additional openings in said conductive element.

2. An assembly as claimed in claim 1 wherein said side walls define said one or more additional openings.

3. An assembly as claimed in claim 2 wherein said exterior portion at least partially covers one or more of said side walls.

4. An assembly as claimed in claim 1 wherein said exterior portion of said encapsulant does not extend on said rear wall.

5. An assembly as claimed in claim 4 wherein said dielectric element has one or more terminal structures thereon electrically connected to said microelectronic element and said exterior portion of said dielectric does not extend onto said terminal structures.

6. An assembly as claimed in claim 1 wherein said side wall portions include a plurality of pillars spaced apart from one another, said one or more additional openings including spaces between adjacent ones of said pillars, said exterior portion of said encapsulant defining.

7. An assembly as claimed in claim 6 wherein said microelectronic element is adapted to operate at an operating frequency and said one or more additionl openings have dimensions less than a wavelength of electromagnetic radiation at said operating frequency.

* * * * *